(12) United States Patent
Lin et al.

(10) Patent No.: US 9,269,673 B1
(45) Date of Patent: Feb. 23, 2016

(54) SEMICONDUCTOR DEVICE PACKAGES

(71) Applicant: ADVANCED SEMICONDUCTOR ENGINEERING, INC., Kaosiung (TW)

(72) Inventors: I-Chia Lin, Kaohsiung (TW); Chieh-Chen Fu, Kaohsiung (TW); Kuo-Hsien Liao, Kaohsiung (TW); Cheng-Nan Lin, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 0 days.

(21) Appl. No.: 14/521,342

(22) Filed: Oct. 22, 2014

(51) Int. Cl.
*H01L 23/552* (2006.01)
*H01L 23/31* (2006.01)
*H01L 23/60* (2006.01)

(52) U.S. Cl.
CPC .............. *H01L 23/552* (2013.01); *H01L 23/60* (2013.01); *H01L 23/31* (2013.01)

(58) Field of Classification Search
CPC .............................. H01L 23/552; H01L 23/31
See application file for complete search history.

(56) References Cited

U.S. PATENT DOCUMENTS

| | | | | |
|---|---|---|---|---|
| 5,639,989 | A * | 6/1997 | Higgins, III | 174/386 |
| 6,350,951 | B1 * | 2/2002 | Askew | 174/521 |
| 7,148,531 | B2 * | 12/2006 | Daughton et al. | 257/295 |
| 7,166,479 | B2 * | 1/2007 | Zhu et al. | 438/3 |
| 7,315,248 | B2 * | 1/2008 | Egbert | 340/572.7 |
| 7,451,539 | B2 | 11/2008 | Morris et al. | |
| 7,943,510 | B2 * | 5/2011 | Takahashi et al. | 438/660 |
| 8,062,930 | B1 | 11/2011 | Shah et al. | |
| 8,133,529 | B2 * | 3/2012 | Lotfi et al. | 427/128 |
| 8,268,677 | B1 | 9/2012 | Pagaila | |
| 8,513,781 | B2 * | 8/2013 | Yoo et al. | 257/659 |
| 8,546,960 | B2 | 10/2013 | Yamazaki | |
| 8,614,120 | B2 * | 12/2013 | Yang | 438/126 |
| 8,664,751 | B2 | 3/2014 | Kim et al. | |
| 8,686,543 | B2 * | 4/2014 | Bergemont et al. | 257/659 |
| 8,813,354 | B2 | 8/2014 | Wu | |
| 8,836,449 | B2 * | 9/2014 | Pang et al. | 333/187 |
| 2005/0184304 | A1 * | 8/2005 | Gupta et al. | 257/98 |
| 2007/0159070 | A1 * | 7/2007 | Hu | 313/504 |
| 2011/0217793 | A1 * | 9/2011 | Takahashi et al. | 438/3 |
| 2015/0061095 | A1 * | 3/2015 | Choi et al. | 257/675 |
| 2015/0123251 | A1 * | 5/2015 | Chiu et al. | 257/659 |

* cited by examiner

*Primary Examiner* — Ida M Soward
(74) *Attorney, Agent, or Firm* — Foley & Lardner LLP; Cliff Z. Liu; Angela D. Murch

(57) ABSTRACT

A semiconductor device package includes a substrate, at least one component, a package body, a first conductive layer, a first shielding layer, a second shielding layer and a second conductive layer. The component is disposed on a first surface of the substrate. The package body is disposed on the first surface of the substrate and covers the component. The first conductive layer covers the package body and at least a portion of the substrate. The first shielding layer covers the first conductive layer and has a first thickness and includes a high conductivity material. The second shielding layer covers the first shielding layer and has a second thickness and includes a high permeability material. A ratio of the first thickness to the second thickness being in a range of 0.2 to 3. The second conductive layer covers the second shielding layer.

20 Claims, 8 Drawing Sheets

SEMICONDUCTOR DEVICE PACKAGES

BACKGROUND

1. Technical Field

The present disclosure relates generally to semiconductor device packages. More particularly, the present disclosure relates to semiconductor device packages with electromagnetic interference shielding.

2. Description of the Related Art

Semiconductor devices have become progressively more complex, driven at least in part by the demand for enhanced processing speeds and smaller sizes. While the benefits of enhanced processing speeds and smaller sizes are apparent, these characteristics of semiconductor devices also can create problems. In particular, higher clock speeds can involve more frequent transitions between signal levels, which, in turn, can lead to a higher level of electromagnetic emissions at higher frequencies or shorter wavelengths. Electromagnetic emissions can radiate from a source semiconductor device, and can be incident upon neighboring semiconductor devices. If the level of electromagnetic emissions at a neighboring semiconductor device is sufficiently high, these emissions can adversely affect the operation of that semiconductor device. This phenomenon is sometimes referred to as electromagnetic interference (EMI). Smaller sized semiconductor devices can exacerbate EMI by providing a higher density of those semiconductor devices within an overall electronic system, and, thus, a higher level of undesired electromagnetic emissions at a neighboring semiconductor device.

One way to reduce EMI is to shield a set of semiconductor devices within a semiconductor device package. In particular, shielding can be accomplished by including an electrically conductive casing or housing that is electrically grounded and is secured to an exterior of the package. When electromagnetic emissions from an interior of the package strike an inner surface of the casing, at least a portion of these emissions can be electrically shorted, thereby reducing the level of emissions that can pass through the casing and adversely affect neighboring semiconductor devices. Similarly, when electromagnetic emissions from a neighboring semiconductor device strike an outer surface of the casing, a similar electrical shorting can occur to reduce EMI of semiconductor devices within the package.

Moreover, signals at a lower frequency (e.g., under 1 GigaHerz (GHz)) being transferred at a higher data rate may also lead to a higher level of electromagnetic emissions. Currently available electrically conductive casing or housing may be capable of dealing with emissions radiated from an electric field generated by a source semiconductor device. However, emissions radiated from a magnetic field or source induced by lower frequency signals transferred at a higher data rate can pass through the electrically conductive casing or housing, and adversely affect the operation of a neighboring semiconductor device.

It is against this background that a need arose to develop the semiconductor device packages and related methods described herein.

SUMMARY

According to an embodiment of the present disclosure, a semiconductor device package is provided. The semiconductor device package includes a substrate, one or more components, a package body, a first conductive layer, a first shielding layer, a second shielding layer and a second conductive layer. The substrate has a first surface, a second surface opposite to the first surface, and a lateral surface extending between the first and second surfaces. The components are disposed on the first surface of the substrate. The package body is disposed on the first surface of the substrate and covers the components. The first conductive layer covers the package body and at least a portion of the substrate. The first shielding layer covers the first conductive layer and has a first thickness and comprises a high conductivity material. The second shielding layer covers the first shielding layer and has a second thickness and comprises a high permeability material. A ratio of the first thickness to the second thickness is in a range of 0.2 to 3. The second conductive layer covers the second shielding layer.

According to another embodiment of the present disclosure, a semiconductor device package is provided. The semiconductor device package includes a substrate, a package body, a first conductive layer, a first shielding layer, a second shielding layer and a second conductive layer. The substrate has a first surface, a second surface opposite to the first surface, and a lateral surface extending between the first and second surfaces. The package body is disposed on the first surface of the substrate. The first conductive layer covers the package body and at least a portion of the substrate. The first shielding layer covers the first conductive layer and has a first thickness and comprises an electrically conductive material. The second shielding layer covers the first shielding layer and has a second thickness and comprises a magnetically permeable material. A sum of the first thickness and the second thickness is in a range of 5 to 20 μm. The second conductive layer covers the second shielding layer. The semiconductor device package also can include one or more components disposed on the first surface of the substrate, and the package body can cover the components.

BRIEF DESCRIPTION OF THE DRAWINGS

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
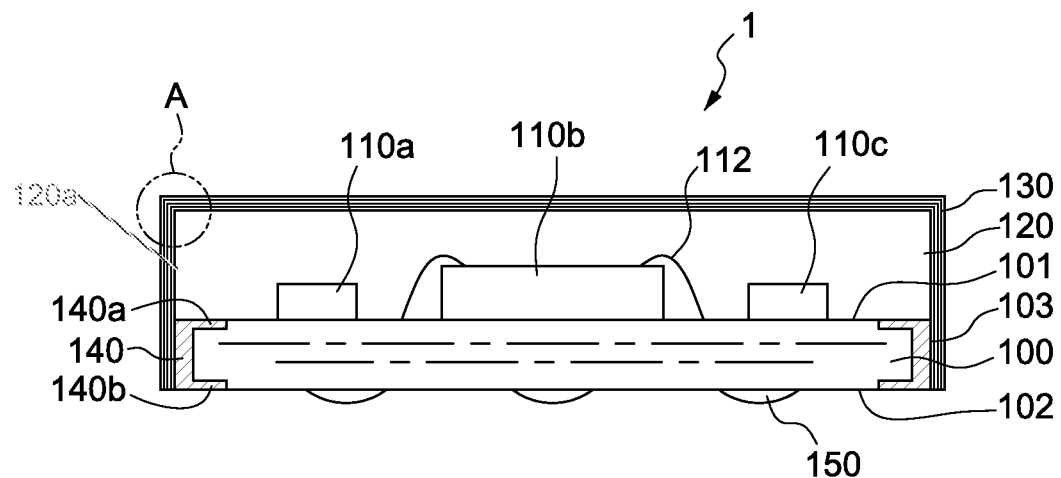
FIG. 1A illustrates a cross-sectional view of a semiconductor device package in accordance with an embodiment of the present disclosure.

FIG. 1A illustrates a cross-sectional view of a semiconductor device package 1 in accordance with an embodiment of the present disclosure. Referring to FIG. 1A, the semiconductor device package 1 includes a substrate 100, a number of components 110a, 110b and 110c, a package body 120, an EMI shield 130, a number of vias 140 and a number of electrical contacts 150.

The substrate 100 comprises a first surface 101 and a second surface 102 opposite to the first surface 101. The substrate 100 also comprises a lateral surface 103 extending between the first surface 101 and the second surface 102. In one embodiment, the lateral surface 103 is substantially planar and has a substantially orthogonal orientation (or substantially 90° orientation) with respect to the first surface 101 or the second surface 102.

The substrate 100 is formed by, for example, a printed circuit board (PCB), such as a paper-based copper foil laminate, a composite copper foil laminate, or a polymer-impregnated glass fiber-based copper foil laminate. The substrate 100 may have electrical interconnects (not shown), such as a redistribution layer (RDL), for electrical connection between the components 110a, 110b and 110c mounted on the first surface 101 of the substrate 100.

The components 110a, 110b and 110c are mounted on the first surface 101 of the substrate 100. In one embodiment, the component 110b is a semiconductor chip, while the components 110a and 110c are passive devices, such as resistors, capacitors, or inductors. The component 110b is wire-bonded to the substrate 100 via a set of wires 112. In another embodiment, the component 110b can be flip chip-bonded to the substrate 100 via a set of solder bumps (not shown). The set of wires 112 may be formed from, for example, gold, copper or another suitable electrically conductive material. The components 110a and 110c are surface mounted to the substrate 100. Although three components are shown in FIG. 1A, more or less components can be included in other embodiments.

The vias 140 are disposed adjacent to a periphery of the substrate 100. More particularly, the vias 140 are disposed adjacent to the lateral surface 103 of the substrate 100. In one embodiment, the vias 140 may be grounding segments. The vias 140 are electrically connected to at least some of the electrical interconnects included in the substrate 100 and provide electrical pathways to reduce EMI. Each of the vias 140 includes a first portion 140a, which is disposed adjacent to the first surface 101 of the substrate 100, and a second portion 140b, which is disposed adjacent to the second surface 102 of the substrate 100. In one embodiment, a height of the vias 140 can be substantially the same as the thickness of the substrate 100, namely where a difference between the height of the vias 140 and the thickness of the substrate 100 is less than or equal to ±10% of the thickness of the substrate 100, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. In one embodiment, the vias 140 are formed from a metal, a metal alloy, or another suitable electrically conductive material.

The electrical contacts 150 are disposed adjacent to the second surface 102 of the substrate 100. The electrical contacts 150 provide input and output electrical connections for the semiconductor device package 1. In one embodiment, at least some of the electrical contacts 150 are electrically connected to the components 110a, 110b, and 110c via at least some of the electrical interconnects included in the substrate 100. In one embodiment, at least one of the electrical contacts 150 is a ground electrical contact, and is electrically connected to the vias 140 through at least some of the electrical interconnects included in the substrate 100.

The package body 120 is disposed on the first surface 101 of the substrate 100 and covers the components 110a, 110b and 110c, a portion of the first surface 101 of the substrate 100 and a portion of the vias 140, so as to provide mechanical stability as well as protection against oxidation, humidity, and other environmental conditions. The package body 120 may include, for example, an epoxy resin having fillers dispersed therein. In one embodiment, a lateral surface 120a of the package body 120, the lateral surface 103 of the substrate and a lateral surface of the vias 140 are substantially coplanar, where, in the illustrated embodiment, the lateral surfaces can be deemed to be substantially coplanar if any displacement between the lateral surfaces is no greater than 10 µm, such as no greater than 8 µm, no greater than 5 µm, or no greater than 1 µm.

The EMI shield 130 covers an upper surface of the package body 120 and the coplanar surface formed by the lateral surface 120a of the package body 120, the lateral surface 103 of the substrate 100 and the lateral surface of the vias 140 to provide protection against EMI. The EMI shield 130 is electrically connected with the lateral surface of the vias 140. When electromagnetic emissions radiated from the interior of the semiconductor device package 1 strike the EMI shield 130, at least a portion of these emissions can be efficiently grounded through the vias 140, thereby reducing the level of emissions that can pass through the EMI shield 130 and adversely affect neighboring semiconductor devices. Similarly, when electromagnetic emissions from a neighboring semiconductor device strike the EMI shield 130, a similar grounding can occur to reduce EMI of the components 110a, 110b and 110c within the semiconductor device package 1.

In one embodiment, the semiconductor device package 1 can be disposed on a PCB and electrically connected to the PCB via the electrical contacts 150 (e.g., solder balls). As previously described, at least one of the electrical contacts 150 is a ground electrical contact, and the ground electrical contact can be electrically connected to a ground voltage provided by the PCB. Grounding of electromagnetic emissions incident upon the EMI shield 130 can occur through an electrical pathway including the vias 140, at least some of the electrical interconnects included in the substrate 100, and the electrical contacts 150. In one embodiment, a lower end of the EMI shield 130 can be directly electrically connected to a ground voltage provided by the PCB, thereby providing an alternative electrical pathway for grounding undesired electromagnetic emissions. In another embodiment, the second portion 140b of the vias can be directly electrically connected to a ground voltage provided by the PCB.

Figure 1B:
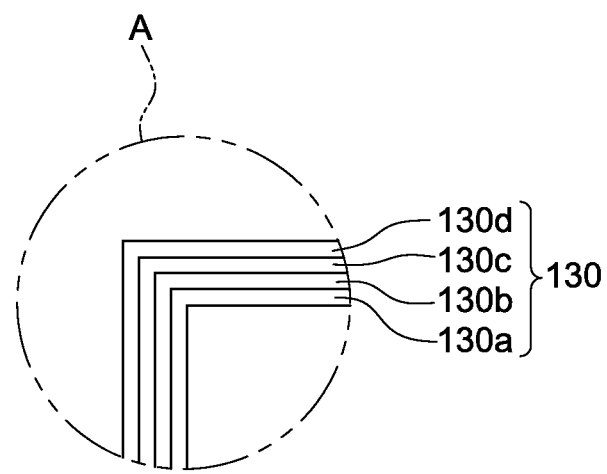
FIG. 1B illustrates an enlarged view of an EMI shield of the semiconductor device package of FIG. 1A, taken along the dotted circle A.

FIG. 1B illustrates an enlarged view of a portion of the EMI shield 130, which is marked as "A" in FIG. 1A. Referring to FIG. 1B, the EMI shield 130 comprises a first conductive layer (e.g., a seed layer) 130a, a first shielding layer 130b, a second shielding layer 130c and a second conductive layer (e.g., a protection layer) 130d.

The seed layer 130a covers the upper surface of the package body 120 and the coplanar surface formed by the lateral surface 120a of package body 120, the lateral surface 103 of the substrate 100 and the lateral surface of the vias 140. The seed layer 130a is formed of, for example, copper (Cu), tin (Sn), stainless steel, another metal or metal alloy, or a combination thereof.

The first shielding layer 130b covers the seed layer 130a. That is, the seed layer 130a is disposed between the package body 120 and the first shielding layer 130b to strengthen the adhesion between the package body 120 and the first shielding layer 130b. In one embodiment, the first shielding layer 130b is formed of a material with high conductivity or high magnetic saturation. In one embodiment, the first shielding layer 130b is formed of, for example, Cu, silver (Ag), another metal or metal alloy, or a combination thereof. One measure of electrical conductivity is in terms of Siemens per meter (S/m). Examples of suitable electrically conductive materials for the first shielding layer 130b include those having a conductivity greater than about $10^4$ S/m, such as at least about $10^5$ S/m, at least about $10^6$ S/m, at least about $3 \times 10^6$ S/m, at least about $4 \times 10^6$ S/m, at least about $5 \times 10^6$ S/m, or at least about $6 \times 10^6$ S/m. Electrical conductivity of a material can measured at room temperature.

The second shielding layer 130c covers the first shielding layer 130b. In one embodiment, the second shielding layer 130c is formed of a material with high permeability or low magnetic saturation. In one embodiment, the second shielding layer 130c is formed of, for example, nickel (Ni), iron (Fe), iron-cobalt alloy (FeCo), iron-nickel alloy (FeNi), nickel-vanadium alloy (NiV), another magnetically permeable metal or metal alloy (e.g., another nickel-containing or iron-containing material), or a combination thereof. One measure of magnetic permeability of a material is in terms of its relative permeability with respect to a permeability of free space. Examples of suitable magnetically permeable materials for the second shielding layer 130c include those having a relative permeability greater than about 1, such as at least about 2, at least about 5, at least about 10, at least about 50, at least about 100, at least about 500, at least about 1000, at least about 5000, at least about $10^4$, at least about $10^5$, or at least about $10^6$. Magnetic permeability of a material can measured at room temperature and at a particular field strength, such as 0.5 Tesla or 0.002 Tesla.

The protection layer 130d covers the second shielding layer 130c. The protection layer 130d serves to protect the first shielding layer 130b and second shielding layer 130c from becoming rusty, and the EMI shielding effect is further enhanced. In one embodiment, the protection layer 130d is formed of, for example, stainless steel, epoxy, NiV, or a combination thereof.

In one embodiment, a ratio of a thickness of the first shielding layer 130b to a thickness of the second shielding layer 130c is in a range of about 0.2 to about 3. In another embodiment, the ratio of the thickness of the first shielding layer 130b to the thickness of the second shielding layer 130c is in a range of about 0.33 to about 1. In another embodiment, the ratio of the thickness of the first shielding layer 130b to the thickness of the second shielding layer 130c is in a range of about 0.5 to about 2. In another embodiment, the ratio of the thickness of the first shielding layer 130a to the thickness of the second shielding layer 130c is about 0.7. In another embodiment, the ratio of the thickness of the first shielding layer 130a to the thickness of the second shielding layer 130c is about 1.

In one embodiment, a sum of the thickness of the first shielding layer 130b and the second shielding layer 130c is in a range of about 5 μm to about 20 μm, such as from about 5 μm to about 7 μm, from about 7 μm to about 18 μm, or from about 9 μm to about 16 μm. In one embodiment, the sum of the thickness of the first shielding layer 130b and the second shielding layer 130c is about 12 μm. In another embodiment, the sum of the thickness of the first shielding layer 130b and the second shielding layer 130c is about 6 μM.

Because the EMI shield 130 comprises two shielding layers, namely the first shielding layer 130b and the second shielding layer 130c that can be formed of different materials, the EMI shield 130 can have characteristics of high conductivity and high permeability. Therefore, the EMI shield 130 of the present disclosure can provide better EMI shielding performance, especially when the components 110a, 110b and 110c of the semiconductor device package 1 are operated at a low frequency. Although four layers are shown for the EMI shield 130, more or less layers can be included in other embodiments.

Figure 1C:
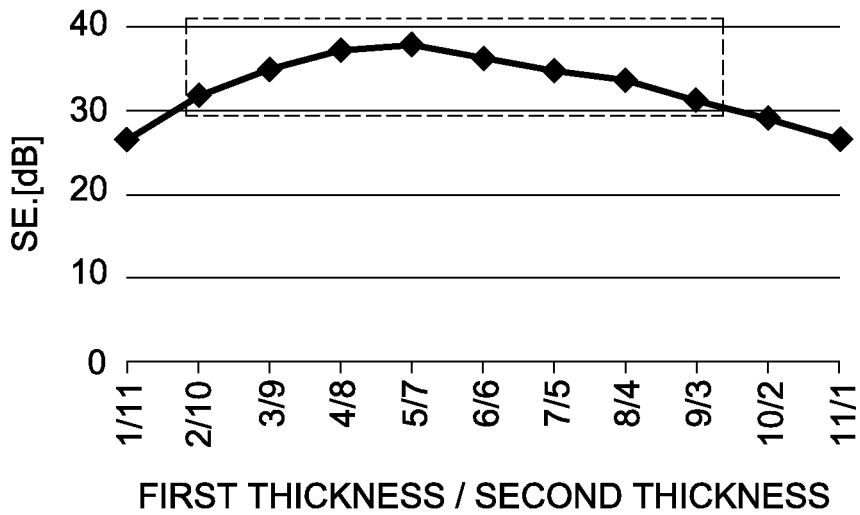
FIG. 1C illustrates a relationship between shielding effectiveness and the structure of the EMI shield of the semiconductor device package of FIG. 1A.

FIG. 1C illustrates a relationship between shielding effectiveness and the ratio of the thickness of the first shielding layer 130b to the thickness of the second shielding layer 130c. In this embodiment, the first shielding layer 130b is formed of Cu, and the second shielding layer 130c is formed of Ni. In FIG. 1C, the x-axis represents the ratio of the thickness of the first shielding layer 130b to the thickness of the second shielding layer 130c, and the y-axis represents the shielding effectiveness (in decibels or dB). The shielding effectiveness relates to a ratio of an intensity of a magnetic field before shielding to an intensity of the magnetic field after shielding. The higher the shielding effectiveness, the better the EMI shielding performance. The shielding effectiveness can be measured at a particular frequency or a range of frequencies, such as under 1 GHz.

According to the simulation results illustrated in FIG. 1C, the EMI shield 130 can provide EMI shielding effectiveness based on the ratio of the thickness of the first shielding layer 130b to the thickness of the second shielding layer 130c, and the shielding effectiveness is at least about 30 dB to achieve better EMI shielding performance. As illustrated in FIG. 1C, the shielding effectiveness is more than about 30 dB (e.g., in a range of about 30 dB to about 40 dB) when the ratio of the thickness of the first shielding layer 130c to the thickness of the second shielding layer 130b is in a range of about 0.2 to about 3.

Figure 1D:
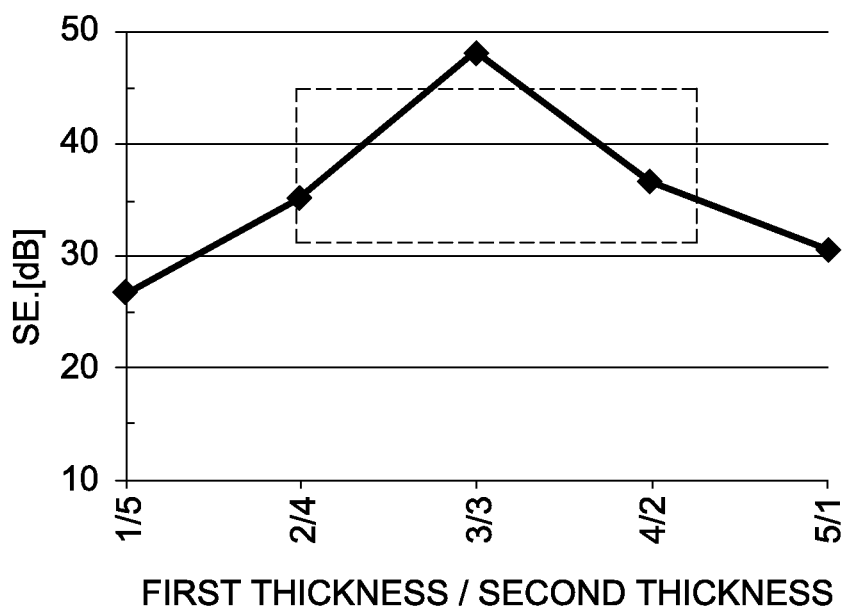
FIG. 1D illustrates a relationship between shielding effectiveness and the structure of the EMI shield of the semiconductor device package of FIG. 1A.

FIG. 1D illustrates a relationship between shielding effectiveness and the ratio of the thickness of the first shielding layer 130b to the thickness of the second shielding layer 130c. In this embodiment, the first shielding layer 130b is formed of Cu, and the second shielding layer 130c is formed of FeNi. As illustrated in FIG. 1D, the shielding effectiveness is more than about 30 dB (e.g., in a range of about 30 dB to about 50 dB) to achieve better EMI shielding performance when the ratio of the thickness of the first shielding layer 130b to the thickness of the second shielding layer 130c is in a range of about 0.5 to about 2. The sum of the thickness of the first shielding layer 130b and the second shielding layer 130c is about 6 μm.

Figure 2:
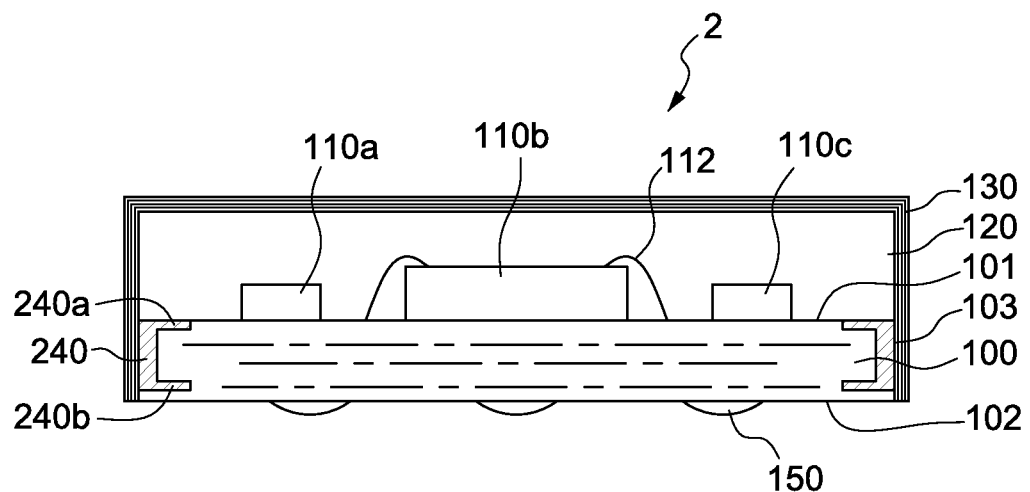
FIG. 2 illustrates a semiconductor device package in accordance with another embodiment of the present disclosure.

FIG. 2 illustrates a cross-sectional view of a semiconductor device package 2 in accordance with another embodiment of the present disclosure. The semiconductor device package 2 is similar to the semiconductor device package 1 as illustrated and described with reference to FIG. 1A, except that a first portion 240a of vias 240 of FIG. 2 is disposed adjacent to the first surface 101 of the substrate 100, and a second portion 240b of the vias 240 is disposed above and at a certain spacing apart from the second surface 102 of the substrate 100. That is, the second portion 240b of the vias 240 is not exposed from the second surface 102 of the substrate 100, and thus a height of the vias 240 is less than the thickness of the substrate 100.

The structure of the vias 240 as shown in FIG. 2 conserves an area of the second surface 102 of the substrate 100 that would otherwise be taken up for EMI shielding functionality, and, in turn, allows a reduced overall package size by reducing or minimizing a footprint area of the semiconductor device package 2.

Figure 3:
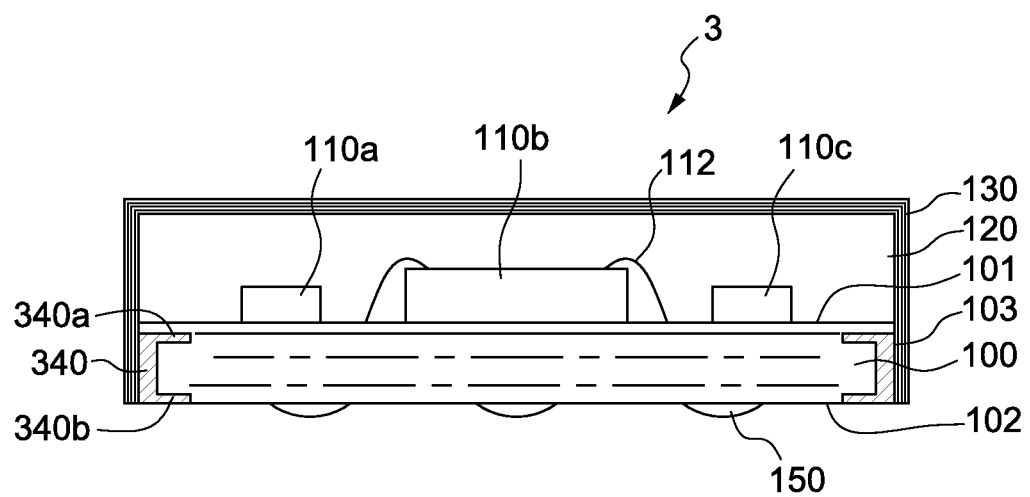
FIG. 3 illustrates a semiconductor device package in accordance with another embodiment of the present disclosure.

FIG. 3 illustrates a cross-sectional view of a semiconductor device package 3 in accordance with another embodiment of the present disclosure. The semiconductor device package 3 is similar to the semiconductor device package 1 as illustrated and described with reference to FIG. 1A, except that a first portion 340a of vias 340 of FIG. 3 is disposed below and at a certain spacing apart from the first surface 101 of the substrate 100, and a second portion 340b of the vias 340 is disposed adjacent to the second surface 102 of the substrate 100. That is, the first portion 340b of the vias 340 is not exposed from the first surface 101 of the substrate 100, and thus a height of the vias 340 is less than the thickness of the substrate 100.

The structure of the vias 340 as shown in FIG. 3 conserves an area of the first surface 101 of the substrate 100 that would otherwise be taken up for EMI shielding functionality, and, in turn, allows a reduced overall package size by reducing or minimizing a footprint area of the semiconductor device package 3.

Figure 4:
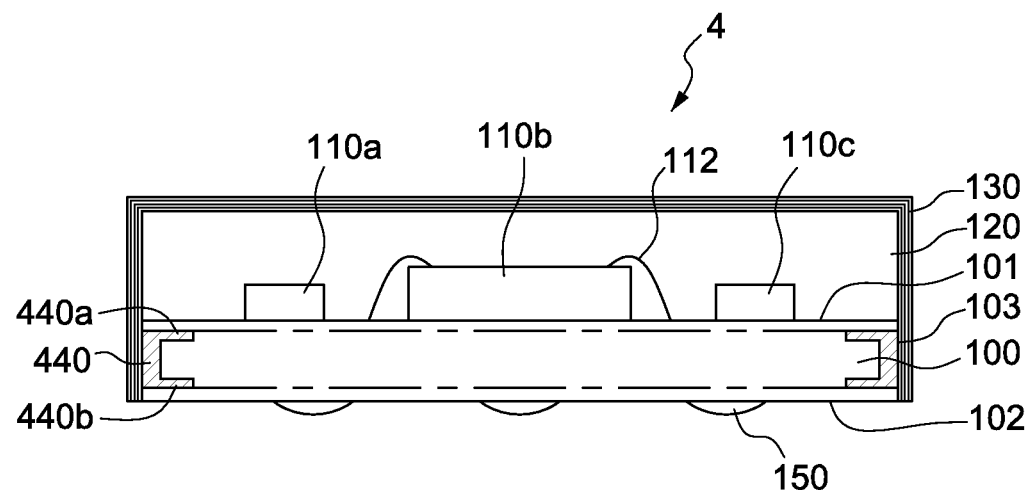
FIG. 4 illustrates a semiconductor device package in accordance with another embodiment of the present disclosure.

FIG. 4 illustrates a cross-sectional view of a semiconductor device package 4 in accordance with another embodiment of the present disclosure. The semiconductor device package 4 is similar to the semiconductor device package 1 as illustrated and described with reference to FIG. 1A, except that a first portion 440a of vias 440 of FIG. 4 is disposed below and at a certain spacing apart from the first surface 101 of the substrate 100, and a second portion 440b of the vias 440 is disposed above and at a certain spacing apart from the second surface 102 of the substrate 100. That is, the first portion 440a of the vias 440 is not exposed from the first surface 101 of the substrate 100, and the second portion 440b of the vias 440 is not exposed from the second surface 102 of the substrate 100, and thus a height of the vias 440 is less than the thickness of the substrate 100.

The structure of the vias 440 as shown in FIG. 4 conserves areas of the first surface 101 and the second surface 102 of the substrate 100 that would otherwise be taken up for EMI shielding functionality, and, in turn, allows a reduced overall package size by reducing or minimizing a footprint area of the semiconductor device package 4.

Figure 5:
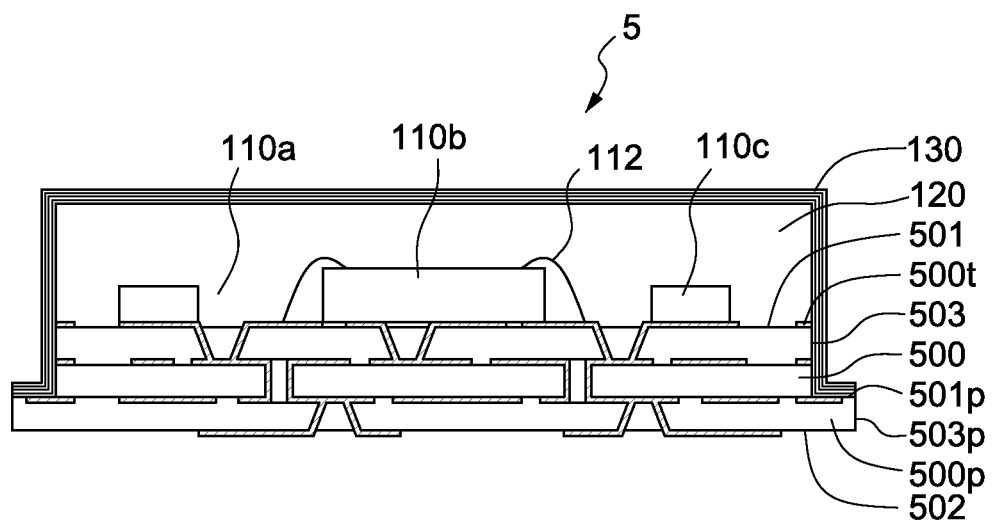
FIG. 5 illustrates a semiconductor device package in accordance with another embodiment of the present disclosure.

FIG. 5 illustrates a cross-sectional view of a semiconductor device package 5 in accordance with another embodiment of the present disclosure. The semiconductor device package 5 is similar to the semiconductor device package 1 as illustrated and described with reference to FIG. 1A, except that a substrate 500 of FIG. 5 further comprises a protruded portion 500p, which extends to a lateral surface 503 of the substrate 500, and that the EMI shield 130 is grounded through traces 500t included in the substrate 500, instead of the vias 140 as shown in FIG. 1A.

Referring to FIG. 5, the substrate 500 comprises a first surface 501, a second surface 502 and the lateral surface 503. The substrate 500 also comprises the protruded portion 500p, and thus a length (or an area) of the second surface 502 of the substrate 500 is greater than that of the first surface 501 of the substrate 500. The substrate 500 comprises the plurality of traces 500t, at least some of which may be connected to each other for electrically connecting the components 110a, 110b and 110c mounted on the first surface 501 of the substrate 500. In one embodiment, at least one of the traces 500t is connected to the EMI shield 130 and a ground, so as to provide a pathway for grounding undesired electromagnetic emissions. In one embodiment, at least some of the traces 500t may be grounding segments. In another embodiment, the EMI shield 130 may be grounded through the vias 140 as shown in FIG. 1A.

The EMI shield 130 covers the upper surface of the package body 120, the lateral surface of package body 120, at least a portion of the lateral surface 503 of the substrate 500, and a top surface 501p of the protruded portion 500p of the substrate 500 to provide protection against EMI. Because the substrate 500 has the protruded portion 500p, the EMI shield 130 is formed as a "L" shape as shown in FIG. 5, and at least a portion of a lateral surface 503p of the substrate 500 is not covered by the EMI shield 130. In one embodiment, at least one of the traces 500t, which may be a grounding segment, is disposed adjacent to the top surface 501p of the substrate 500, with a portion of the grounding segment covered by the package body 120, and another portion of the grounding segment exposed from the package body for electrical connection to the EMI shield 130.

FIG. 6A, FIG. 6B, FIG. 6C and FIG. 6D illustrate a process of forming the semiconductor device package 1 as shown in FIG. 1A, according to an embodiment of the present disclosure.

Figure 6A:
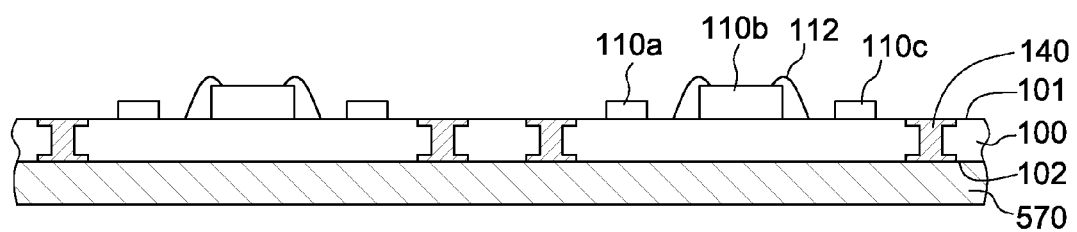
FIG. 6A, FIG. 6B, FIG. 6C and FIG. 6D illustrate a manufacturing process in accordance with an embodiment of the present disclosure.

Referring to FIG. 6A, a substrate strip with a plurality of substrates 100 is provided, where each substrate 100 has a first surface 101 and a second surface 102. The second surface 102 of the substrate 100 is attached to a tape 570. In one embodiment, the tape 570 may be a single-sided or double-sided adhesive tape.

Components 110a, 110b and 110c are mounted on the first surface 101 of the substrate 100. In one embodiment, the component 110b can be wire-bonded to the substrate 100 via a set of wires 112. In another embodiment, the component 110b can be flip chip-bonded to the substrate 100 via a set of solder bumps (not shown). The components 110a and 110c are surface mounted to the substrate 100.

A number of vias 140 are formed in the substrate 100. The vias 140 are connected to electrical interconnects included in the substrate 100 and provide electrical pathways to reduce EMI.

In one embodiment, the vias 140 can be formed by the following operations: (i) forming openings by, for example, photolithography, chemical etching, laser drilling, or mechanical drilling; and (ii) plating the openings by using, for example, a metal, a metal alloy, a matrix with a metal or a metal alloy dispersed therein, or another suitable electrically conductive material.

Figure 6B:
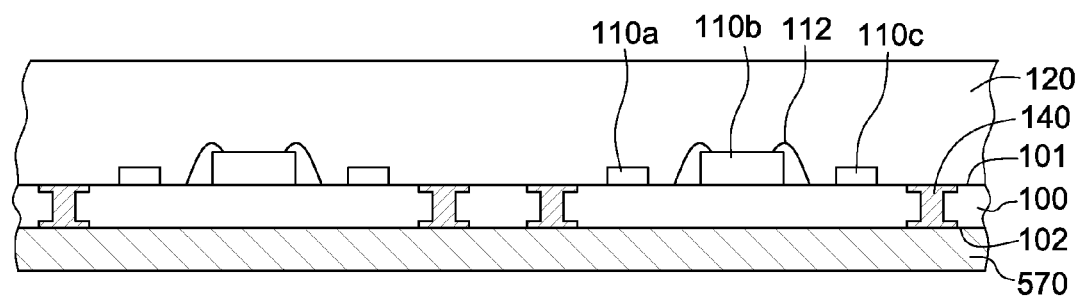

Referring to FIG. 6B, a package body 120 may be formed by applying an encapsulant to the first surface 101 of the substrate 100 so as to substantially cover or encapsulate the components 110a, 110b and 110c, a portion of the first surface 101 of the substrate 100 and a portion of the vias 140. In one embodiment, the encapsulant can include, for example, a Novolac-based resin, an epoxy-based resin, a silicone-based resin, or another suitable material. In one embodiment, the encapsulant can be applied by using any of a number of molding techniques, such as compression molding, injection molding, or transfer molding.

Figure 6C:
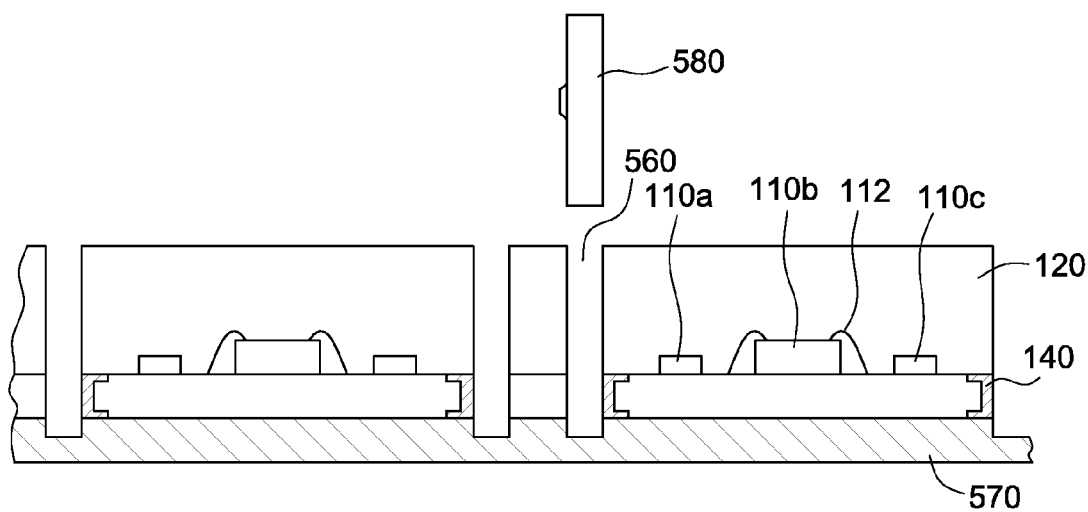

Referring to FIG. 6C, a singulation process is performed by using a cutting tool 580, such as a saw, to divide a semiconductor package structure strip into a plurality of individual semiconductor device packages. The cutting tool 580 forms cutting slits 560. The cutting slits 560 extend downwardly and completely through the package body 120 and the substrate 100 and partially through the tape 570. Such manner of singulation can be referred to as "full-cut" singulation, since division of the package body 120 and the substrate 100 at each of various locations can occur through one singulation operation, rather than multiple singulation operations, such as multiple "half-cut" singulations.

Figure 6D:
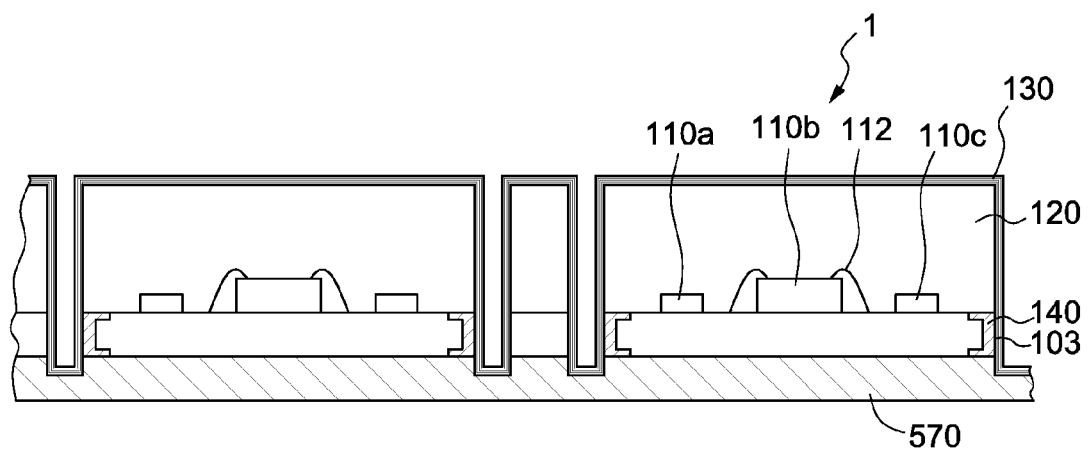

Referring to FIG. 6D, an EMI shield 130 is formed adjacent to exposed surfaces, including exterior surfaces of the package body 120, a lateral surface of the vias 140, and a lateral surface 103 of the substrate 100. The EMI shield 130 can be formed by using any of a number of coating techniques, such as chemical vapor deposition (CVD), physical vapor deposition (PVD), electroless plating, electroplating, printing, spraying, sputtering, or vacuum deposition.

In one embodiment, the EMI shield 130 is multi-layered, which comprises a seed layer 130a, a first shielding layer 130b, a second shielding layer 130c and a protection layer 130d, as shown in FIG. 1B, and thus different layers can be formed using the same coating technique or different coating techniques. In one embodiment, the process of forming the EMI shield 130 may comprise the following operations: (i) forming the seed layer 130a by PVD, CVD, electroless plating, electroplating or sputtering; (ii) forming the first shielding layer 130b and the second shielding layer 130c by PVD, CVD, electroless plating, electroplating or spraying; and (iii) forming the protection layer 130d by PVD, CVD, electroless plating, electroplating or spraying. In one embodiment, the first shielding layer 130b can be formed of copper by sputtering, and the second shielding layer 130c can be formed of nickel by electroplating, so as to enhance the permeability of the EMI shield 130.

Then, the substrate 100 is removed from the tape 570 by using, for example, a pick-and-place technique, so as to form the semiconductor device package 1 as shown in FIG. 1A.

FIG. 7A, FIG. 7B, FIG. 7C and FIG. 7D illustrate a process of forming the semiconductor device package 5 as shown in FIG. 5, according to an embodiment of the present disclosure.

Figure 7A:
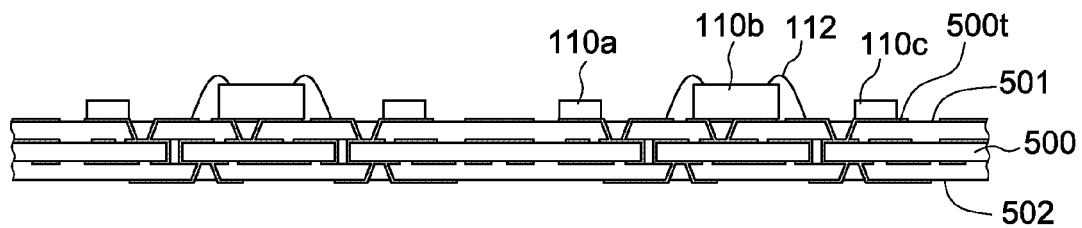
FIG. 7A, FIG. 7B, FIG. 7C and FIG. 7D illustrate a manufacturing process in accordance with another embodiment of the present disclosure.

Referring to FIG. 7A, a substrate strip with a plurality of substrates 500 is provided, where each substrate 500 has a first surface 501 and a second surface 502. The substrate 500 may be patterned to include a plurality of traces 500t, and the traces 500t may be electrically connected to one another.

Components 110a, 110b and 110c are mounted on the first surface 501 of the substrate 500. In one embodiment, the component 110b can be wire-bonded to the substrate 500 via a set of wires 112. In another embodiment, the component 110b can be flip-chip bonded to the substrate 500 via a set of solder bumps (not shown). The components 110a and 110c are surface mounted to the substrate 500.

Figure 7B:
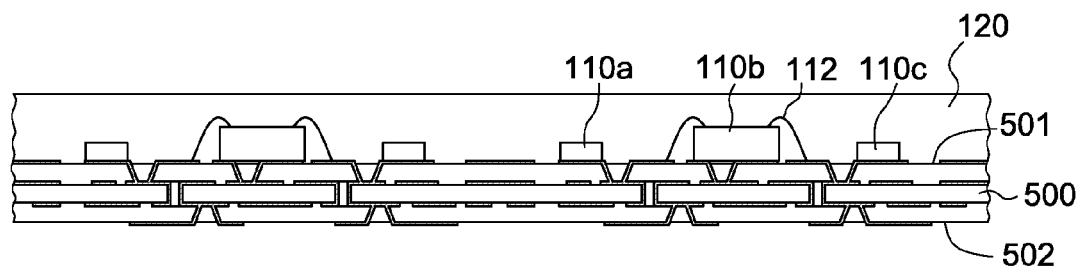

Referring to FIG. 7B, a package body 120 may be formed by applying an encapsulant to the first surface 501 of the substrate 500 so as to substantially cover or encapsulate the components 110a, 110b and 110c and a portion of the first surface 501 of the substrate 500. In one embodiment, the encapsulant can include, for example, a Novolac-based resin, an epoxy-based resin, a silicone-based resin, or another suitable material. In one embodiment, the encapsulant can be applied by using any of a number of molding techniques, such as compression molding, injection molding, or transfer molding.

Figure 7C:
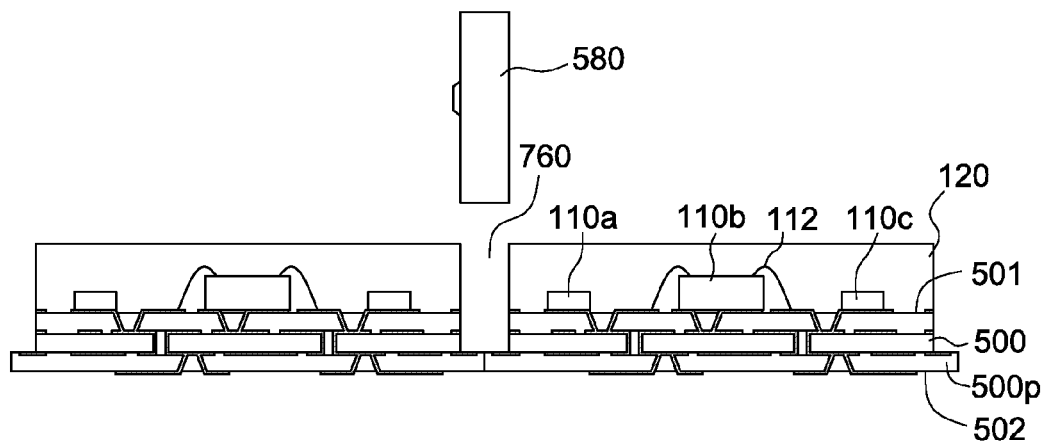

Referring to FIG. 7C, a half-cutting process is performed by using a cutting tool 580, such as a saw, which forms a plurality of cutting slits 760. The cutting slits 760 extend downwardly and completely through the package body 120 and partially through the substrate 500. In other words, the substrate 500 is not completely cut through in the half-cutting process, and a protruded portion 500p of the substrate 500 remains.

Figure 7D:
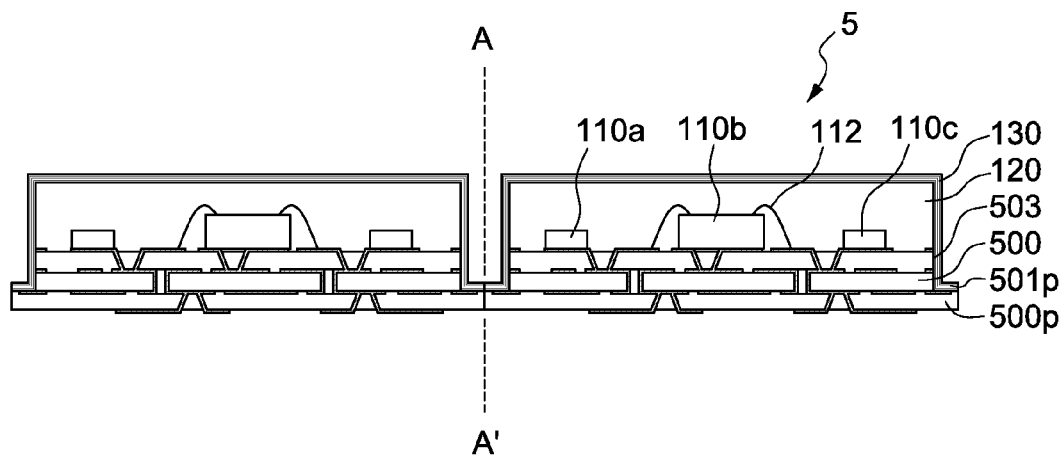

Referring to FIG. 7D, an EMI shield 130 is formed adjacent to exposed surfaces, including exterior surfaces of the package body 120, a lateral surface 503 of the substrate 500 and a top surface 501p of the protruded portion 500p of the substrate 500. The EMI shield 130 can be formed by using any of a number of coating techniques, such as CVD, PVD, electroless plating, electroplating, printing, spraying, sputtering, or vacuum deposition.

In one embodiment, the EMI shield 130 is multi-layered, which comprises a seed layer 130a, a first shielding layer 130b, a second shielding layer 130c and a protection layer 130d, as shown in FIG. 1B, and thus different layers can be formed using the same coating technique or different coating techniques. In another embodiment, the process of forming the EMI shield 130 may comprise the following operations: (i) forming the seed layer 130a by using PVD, CVD, electroless plating, electroplating or sputtering; (ii) forming the first shielding layer 130b and the second shielding layer 130c by using PVD, CVD, electroless plating, electroplating or spraying; and (iii) forming the protection layer 130d by PVD, CVD, electroless plating, electroplating or spraying. In one embodiment, the first shielding layer 130b can be formed of copper by sputtering, and the second shielding layer 130c can be formed of nickel by electrode plating, so as to enhance the permeability of the EMI shield 130.

Then, a singulation process is performed by cutting through the substrate 500 along the dotted line A-A', so as to form the semiconductor device package 5 as shown in FIG. 5. The singulation process may be performed by, for example, a blade sawing process or a laser cutting process.

As used herein, the terms "substantially," "substantial," "approximately," and "about" are used to describe and account for small variations. When used in conjunction with an event or circumstance, the terms can refer to instances in which the event or circumstance occurs precisely as well as instances in which the event or circumstance occurs to a close approximation. For example, the terms can refer to less than or equal to ±10%, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Additionally, amounts, ratios, and other numerical values are sometimes presented herein in a range format. It is to be understood that such a range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not be necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, subdivided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package comprising:
   a substrate having a first surface, a second surface opposite to the first surface, and a lateral surface extending between the first and second surfaces;
   at least one component mounted on the first surface of the substrate;
   a package body disposed on the first surface of the substrate and covering the component;
   a first conductive layer covering the package body and at least a portion of the substrate;
   a first shielding layer covering the first conductive layer, the first shielding layer having a first thickness and comprising a high conductivity material;
   a second shielding layer covering the first shielding layer, the second shielding layer having a second thickness and comprising a high permeability material, a ratio of the first thickness to the second thickness being in a range of 0.2 to 3; and
   a second conductive layer covering the second shielding layer.

2. The semiconductor device package of claim 1, wherein the ratio of the first thickness to the second thickness being in a range of 0.33 to 1.

3. The semiconductor device package of claim 1, wherein the high conductivity material is selected from Cu and Ag, and the high permeability material is selected from Ni, Fe, FeCo, FeNi and NiV.

4. The semiconductor device package of claim 1, wherein a sum of the first thickness and the second thickness is in a range of 5 μm to 20 μm.

5. The semiconductor device package of claim 4, wherein the sum of the first thickness and the second thickness is in a range of 9 μm to 16 μm.

6. The semiconductor device package of claim 4, wherein the sum of the first thickness and the second thickness is in a range of 5 μm to 7 μm.

7. The semiconductor device package of claim 1, wherein the substrate comprises a grounding segment electrically connected to the first conductive layer.

8. The semiconductor device package of claim 7, wherein the grounding segment is disposed adjacent to the first surface of the substrate, a portion of the grounding segment is covered by the package body, and another portion of the grounding segment is exposed from the package body.

9. The semiconductor device package of claim 7, wherein the grounding segment is disposed in the substrate and exposed from the lateral surface of the substrate.

10. The semiconductor device package of claim 9, wherein the grounding segment is a via extending between the first surface and the second surface of the substrate.

11. The semiconductor device package of claim 9, wherein the grounding segment is a trace extending laterally to the lateral surface of the substrate.

12. A semiconductor device package comprising:
    a substrate having a first surface, a second surface opposite to the first surface, and a lateral surface extending between the first and second surfaces;
    a package body disposed on the first surface of the substrate;
    a first conductive layer covering the package body and at least a portion of the substrate;
    a first shielding layer covering the first conductive layer, the first shielding layer having a first thickness and comprising an electrically conductive material;
    a second shielding layer covering the first shielding layer, the second shielding layer having a second thickness and comprising a magnetically permeable material, wherein a sum of the first thickness and the second thickness is in a range of 5 μm to 20 μm; and
    a second conductive layer covering the second shielding layer.

13. The semiconductor device package of claim 12, wherein the sum of the first thickness and the second thickness is in a range of 9 μm to 16 μm.

14. The semiconductor device package of claim 12, wherein the electrically conductive material is selected from Cu and Ag, and the magnetically permeable material is selected from Ni, Fe, FeCo, FeNi and NiV.

15. The semiconductor device package of claim 12, wherein a ratio of the first thickness to the second thickness being in a range of 0.33 to 1.

16. The semiconductor device package of claim 12, wherein the substrate comprises a grounding segment electrically connected to the first conductive layer.

17. The semiconductor device package of claim 16, wherein the grounding segment is disposed adjacent to the first surface of the substrate, a portion of the grounding segment is covered by the package body, and another portion of the grounding segment is exposed from the package body.

18. The semiconductor device package of claim 16, wherein the grounding segment is disposed in the substrate and exposed from the lateral surface of the substrate.

19. The semiconductor device package of claim 18, wherein the grounding segment is a via extending between the first surface and the second surface of the substrate.

20. The semiconductor device package of claim 18, wherein the grounding segment is a trace extending laterally to the lateral surface of the substrate.

* * * * *